(12) United States Patent
Hisamatsu et al.

(10) Patent No.: US 12,334,343 B2
(45) Date of Patent: Jun. 17, 2025

(54) SUBSTRATE PROCESSING METHOD AND SUBSTRATE PROCESSING SYSTEM

(71) Applicant: Tokyo Electron Limited, Tokyo (JP)

(72) Inventors: Toru Hisamatsu, Miyagi (JP);
Takayuki Katsunuma, Miyagi (JP);
Shinya Ishikawa, Miyagi (JP);
Yoshihide Kihara, Miyagi (JP);
Masanobu Honda, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 18/626,719

(22) Filed: Apr. 4, 2024

(65) Prior Publication Data

US 2024/0282578 A1    Aug. 22, 2024

Related U.S. Application Data

(62) Division of application No. 17/298,332, filed as application No. PCT/JP2019/027722 on Jul. 12, 2019, now Pat. No. 11,955,337.

(30) Foreign Application Priority Data

Nov. 30, 2018 (JP) ................................. 2018-225894

(51) Int. Cl.
*H01L 21/033* (2006.01)
*H01L 21/311* (2006.01)
*C23C 16/04* (2006.01)

(52) U.S. Cl.
CPC .... *H01L 21/0337* (2013.01); *H01L 21/31144* (2013.01); *C23C 16/042* (2013.01)

(58) Field of Classification Search
None
See application file for complete search history.

(56) References Cited

U.S. PATENT DOCUMENTS 11,450,537 B2 *  9/2022  Kumakura .............. C23C 16/50
2005/0023609 A1 *  2/2005  Nagano .................. H10D 86/01
257/E21.703

(Continued)

FOREIGN PATENT DOCUMENTS

JP    2008-053734 A    3/2008
JP    2010-165954 A    7/2010

(Continued)

OTHER PUBLICATIONS

International Search Report issued on Sep. 10, 2019 for PCT/JP2019/027722, 4 pages.

*Primary Examiner* — Roberts P Culbert
(74) *Attorney, Agent, or Firm* — XSENSUS LLP

(57) ABSTRACT

A substrate processing apparatus includes a chamber; a substrate support disposed in the chamber; a gas supply that supplies a gas into the chamber; and a controller that controls an overall operation of the substrate processing apparatus. The controller executes a process including: (a) placing a substrate on the substrate support, the substrate including an etching layer and a patterned mask on the etching layer; (b) forming a film on the patterned mask; (c) forming a reaction layer on the film; and (d) removing the reaction layer by applying energy to the reaction layer. In the step (c) a temperature of the substrate is set according to a thickness of the reaction layer to be formed.

18 Claims, 18 Drawing Sheets

(56) References Cited

U.S. PATENT DOCUMENTS

| | | |
|---|---|---|
| 2010/0216314 A1 | 8/2010 | Honda |
| 2017/0236719 A1 | 8/2017 | O'Meara et al. |
| 2017/0243754 A1 | 8/2017 | Tavernier et al. |
| 2021/0134595 A1 | 5/2021 | Su et al. |

FOREIGN PATENT DOCUMENTS

| | | |
|---|---|---|
| JP | 2010-192825 A | 9/2010 |
| JP | 2017-011127 A | 1/2017 |
| JP | 2017-143194 A | 8/2017 |
| KR | 2017-0115962 A | 10/2017 |
| KR | 2017-0131219 A | 11/2017 |
| KR | 2018-0034167 A | 4/2018 |

* cited by examiner

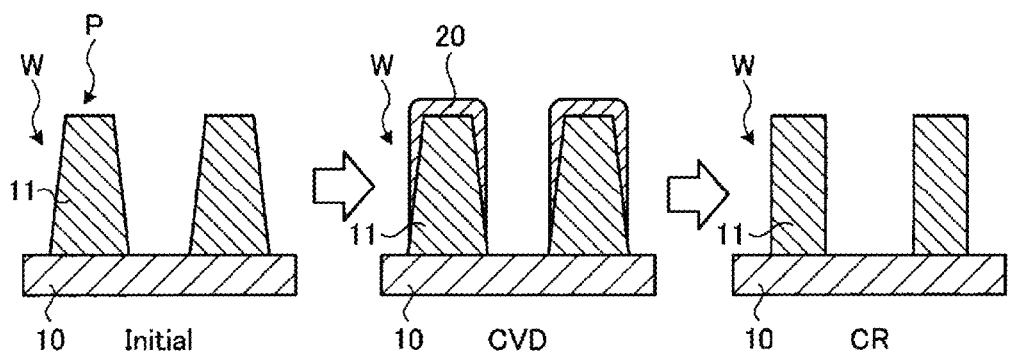
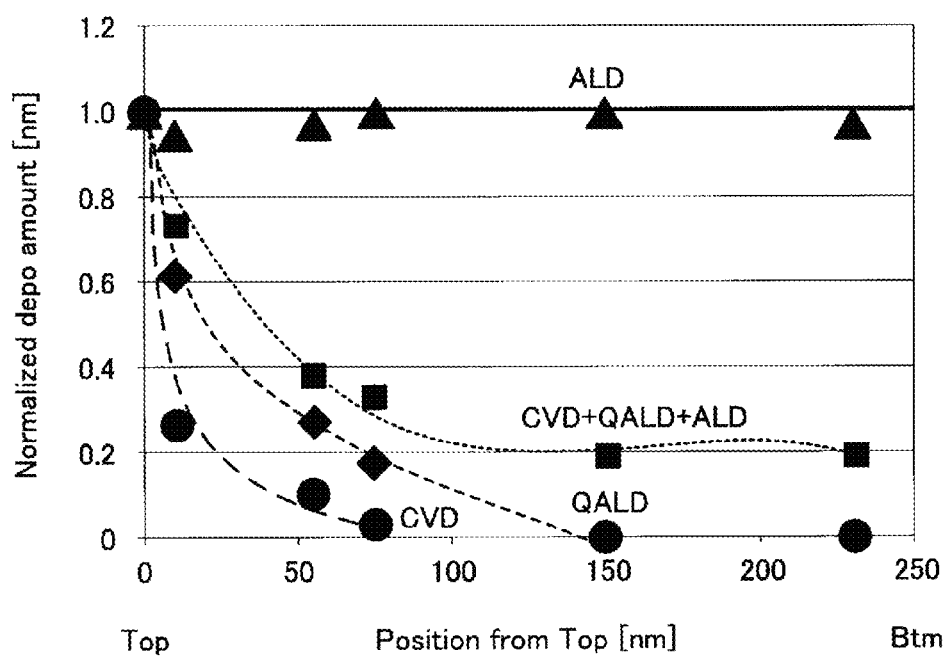

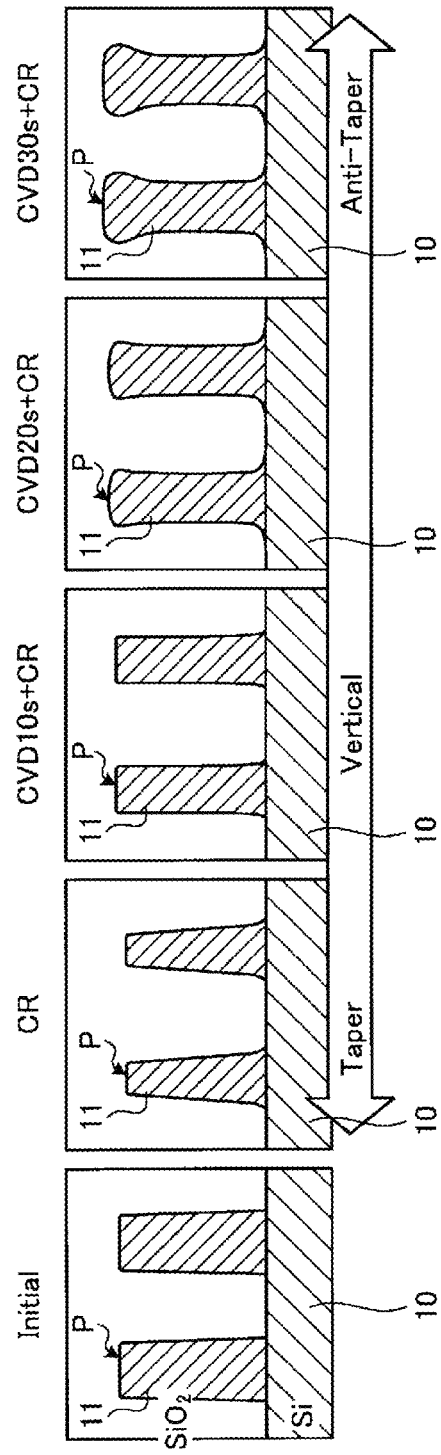

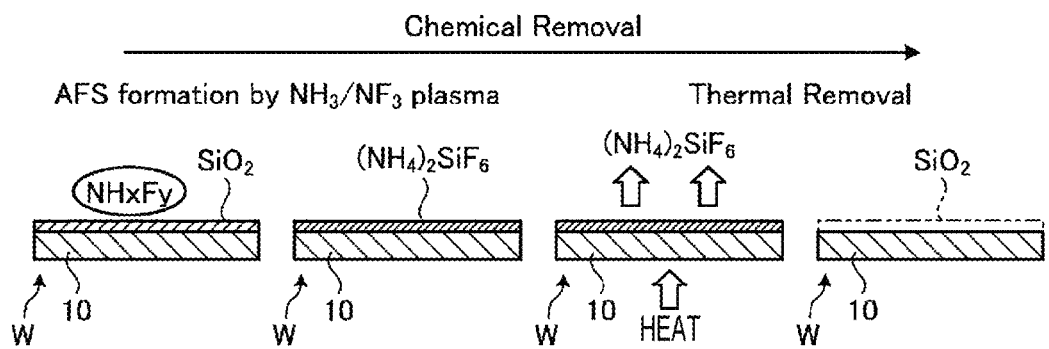
FIG. 8A  FIG. 8B  FIG. 8C  FIG. 8D
FIG. 9
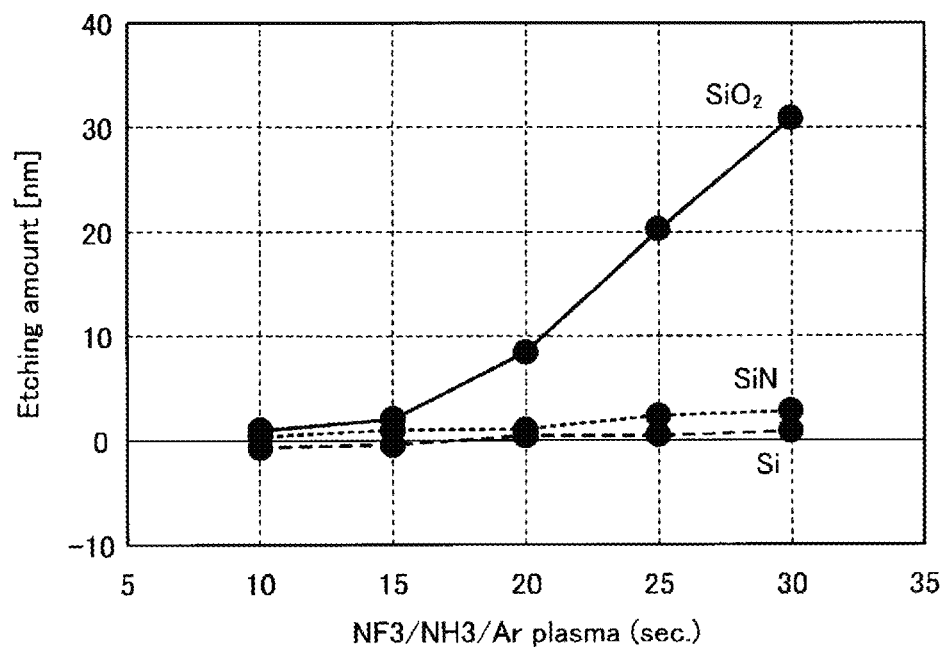

| | Initial | ALD | ALD+CR (10C,10sec) | ALD+CR120s (50C,120s) |
|---|---|---|---|---|
| Dense | L-CD=46.83nm LWR/LER=3.08/2.32 | L-CD=52.25nm (Δ 5.42nm) LWR/LER=2.70/2.27 | L-CD=42.97nm (Δ −3.86nm) LWR/LER=3.48/2.87 | L-CD=44.15nm (Δ −2.68nm) LWR/LER=2.84/2.36 |
| Iso | L-CD=56.38nm LWR/LER=3.27/2.46 | L-CD=60.49nm (Δ 4.11nm) LWR/LER=3.54/3.21 | L-CD=38.74nm (Δ −17.64nm) LWR/LER=4.53/3.90 | L-CD=51.79nm (Δ −4.59nm) LWR/LER=2.91/3.08 |

FIG. 21

SUBSTRATE PROCESSING METHOD AND SUBSTRATE PROCESSING SYSTEM

CROSS-REFERENCE TO RELATED APPLICATIONS

This application is a divisional application of U.S. patent application Ser. No. 17/298,332, filed on May 28, 2021, which is a national phase of PCT application No. PCT/JP2019/027722, filed on Jul. 12, 2019, which claims priority from Japanese Patent Application No. 2018-225894, filed on Nov. 30, 2018, all of which are incorporated herein in their entireties by reference.

TECHNICAL FIELD

The present disclosure relates to a substrate processing method and a substrate processing system.

BACKGROUND

Patent Document 1 discloses a technique for removing (etching) a natural oxide film on a wafer by reacting a processing gas with the natural oxide film to form a reaction layer, and then heating the wafer to sublimate the reaction layer.

PRIOR ART DOCUMENT

Patent Document

Patent Document 1: Japanese Patent Laid-Open Publication No. 2010-165954

SUMMARY OF THE INVENTION

Problems to be Solved

The present disclosure provides a technique capable of controlling a pattern formed on a substrate to a desired state.

Means to Solve the Problems

A substrate processing method according to an aspect of the present disclosure includes providing a substrate including a mask, forming a film on the mask, forming a reaction layer on a surface layer of the film, and removing the reaction layer by applying energy to the reaction layer.

Effect of the Invention

According to the present disclosure, the pattern formed on the substrate may be controlled to a desired state.

BRIEF DESCRIPTION OF THE DRAWINGS

FIGS. 3A to 3C are diagrams illustrating an example of a flow of substrate processing according to the embodiment.

FIG. 4 is a diagram illustrating an example of a film forming region and a film forming amount for each film forming method according to the embodiment.

FIGS. 5A to 5E are diagrams illustrating an example of a change in the shape of a pattern according to the embodiment.

FIGS. 8A to 8D are diagrams illustrating an example of a flow of the CR processing according to the embodiment.

FIG. 9 is a diagram illustrating an example of an etching amount by the CR processing according to the embodiment.

FIG. 14 is a diagram illustrating an example of a pattern change in the CR processing depending on the presence or absence of preheating according to the embodiment.

FIG. 17 is a diagram illustrating an example of a change in the width of the pattern depending on the density of the pattern according to the embodiment.

FIG. 21 is a diagram illustrating an example of changes in LWR and LER caused by performing the film forming process and the CR processing according to the embodiment.

DETAILED DESCRIPTION TO EXECUTE THE INVENTION

Hereinafter, embodiments of a substrate processing method and a substrate processing system described in the present disclosure will be described in detail with reference to the accompanying drawings. The present embodiments do not limit the disclosed substrate processing method and substrate processing system.

[Apparatus Configuration]

An example of an apparatus used for the substrate processing according to the present embodiment will be described. Hereinafter, descriptions will be made on an example in which the substrate processing according to the present embodiment is performed by a substrate processing system using the plasma processing apparatus and a heating apparatus.

Figure 1:
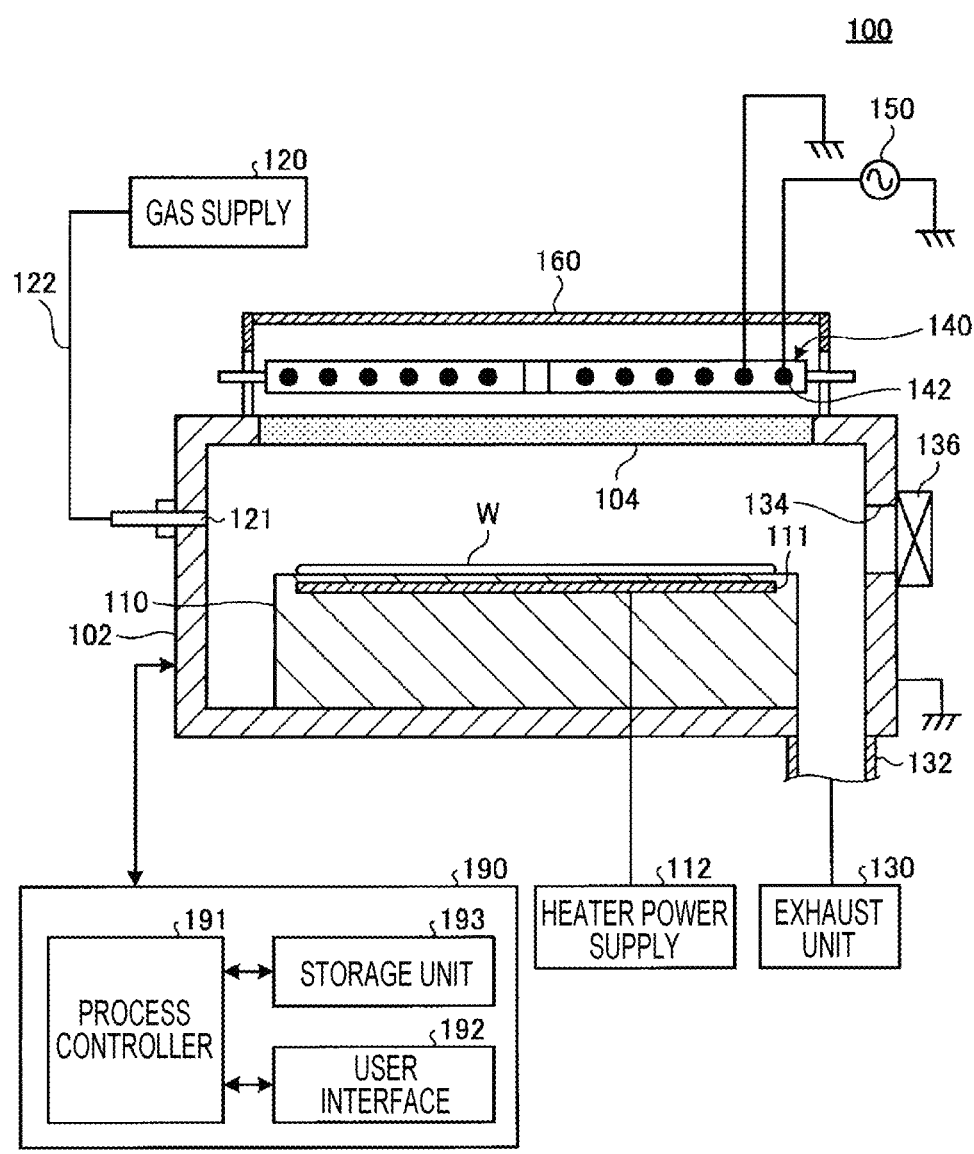
FIG. 1 is a diagram illustrating an example of a schematic configuration of a plasma processing apparatus according to an embodiment.

Hereinafter, an example of the configuration of the plasma processing apparatus according to the present embodiment will be described. FIG. 1 is a diagram illustrating an example of a schematic configuration of the plasma processing apparatus according to the embodiment. In the present embodiment, a case where the plasma processing apparatus 100 is an inductively coupled plasma (ICP) type plasma processing apparatus will be described as an example.

The plasma processing apparatus 100 includes a processing chamber 102 formed in a tubular shape made of metal (e.g., aluminum).

A stage 110 for mounting a semiconductor wafer (hereinafter, also referred to as a "wafer") W is provided at the bottom of the processing chamber 102. The stage 110 is formed in a columnar shape made of aluminum. The stage 110 is provided with a heater 111. The heater 111 is connected to a heater power supply 112 and generates heat by the electric power supplied from the heater power supply 112. The stage 110 controls the temperature of the wafer W by the heater 111. Although not illustrated, the stage 110 may be provided with necessary functions such as an electrostatic chuck that attracts and holds the wafer W by electrostatic force, and a temperature adjusting mechanism such as a coolant flow path. When the plasma processing apparatus 100 is used as an etching apparatus, a radio-frequency bias for drawing ions into the wafer W is applied to the stage 110.

A plate-shaped dielectric 104 made of, for example, quartz glass or ceramic is provided on the ceiling of the processing chamber 102 to face the stage 110. Specifically, the dielectric 104 is formed, for example, in a disc shape and is airtightly attached to close the opening formed in the ceiling of the processing chamber 102.

A gas supply 120 for supplying various gases used for processing the wafer W is connected to the processing chamber 102. A gas introduction port 121 is formed on the side wall of the processing chamber 102. The gas supply 120 is connected to the gas introduction port 121 via a gas supply pipe 122.

The gas supply 120 is connected to gas supply sources of various gases used for processing the wafer W via gas supply lines, respectively. Each of the gas supply lines is appropriately branched according to the substrate processing, and is provided with an on-off valve and a flow rate controller. The gas supply 120 controls the flow rate of various gases by controlling the on-off valve and the flow rate controller provided in each gas supply line. The gas supply 120 supplies various gases to the gas supply pipe 122 according to the substrate processing. Various gases supplied to the gas supply pipe 122 are supplied into the processing chamber 102 from the gas introduction port 121. In FIG. 1, a case where the gas supply 120 is configured to supply gas from the side wall of the processing chamber 102 is taken as an example, but the present disclosure is not necessarily limited thereto. For example, the gas may be supplied from the ceiling of the processing chamber 102. In this case, for example, a gas introduction port may be formed in the central portion of the dielectric 104 to supply gas from the central portion of the dielectric 104.

An exhaust unit 130 for exhausting the atmosphere in the processing chamber 102 is connected to the bottom of the processing chamber 102 via an exhaust pipe 132. The exhaust unit 130 is configured by, for example, a vacuum pump, and decompresses the inside of the processing chamber 102 to a predetermined pressure. A wafer loading/unloading port 134 is formed on the side wall of the processing chamber 102. A gate valve 136 is provided at the wafer loading/unloading port 134. For example, when loading the wafer W, the gate valve 136 is opened, the wafer W is placed on the stage 110 in the processing chamber 102 by a transfer mechanism such as a transfer arm (not illustrated), and the gate valve 136 is closed to process the wafer W.

On the ceiling of the processing chamber 102, a flat radio-frequency antenna 140 and a shield member 160 covering the radio-frequency antenna 140 are arranged on the upper side surface (outer surface) of the dielectric 104. The radio-frequency antenna 140 is provided with an antenna element 142. The antenna element 142 is formed in a spiral coil shape made of a conductor such as copper, aluminum, or stainless steel. A radio-frequency power supply 150 is connected to the antenna element 142. The radio-frequency power supply 150 supplies radio-frequency power of a predetermined frequency (e.g., 40 MHz) to the antenna element 142 that generates plasma. Further, the radio-frequency output from the radio-frequency power supply 150 is not limited to the frequencies described above. For example, various frequencies such as 13.56 MHz, 27 MHz, 40 MHz, and 60 MHz may be used.

When a radio-frequency is supplied to the antenna element 142 from the radio-frequency power supply 150, an induced magnetic field is formed in the processing chamber 102. The formed induced magnetic field excites the gas introduced into the processing chamber 102, and plasma is generated on the wafer W. The radio-frequency antenna 140 may be provided with a plurality of antenna elements 142, and radio-frequencies of the same frequency or different frequencies may be applied to each of the antenna elements 142 from the radio-frequency power supply 150. For example, the plasma processing apparatus 100 may provide the radio-frequency antenna 140 with antenna elements 142 separately for the central portion and the peripheral portion of the dielectric 104, and control the plasma at the central portion and the peripheral portion of the dielectric 104, respectively. Further, the plasma processing apparatus 100 may generate plasma by supplying radio-frequency power to the lower electrodes constituting the stage 110 in addition to the radio-frequency antenna 140 provided on the ceiling of the processing chamber 102.

The plasma processing apparatus 100 may perform a plasma processing such as an etching or a film formation on the wafer W by using the generated plasma.

The operation of the plasma processing apparatus 100 configured as described above is collectively controlled by a controller 190. The controller 190 includes a process controller 191 that is provided with a CPU and controls each unit of the plasma processing apparatus 100, a user interface 192, and a storage unit 193.

The process controller 191 controls various operations of the plasma processing apparatus 100. For example, the process controller 191 controls the supply operation of various gases from the gas supply 120. Further, the process controller 191 controls the frequency and power of the radio-frequency supplied from the radio-frequency power supply 150 to the antenna element 142. The process controller 191 controls the temperature of the wafer W by controlling the electric power supplied from the heater power supply 112 to the heater 111 and controlling the amount of heat generated by the heater 111.

The user interface 192 includes a keyboard for the operator to input commands for managing the plasma processing apparatus 100, and a display for visualizing and displaying the operating status of the plasma processing apparatus 100.

The storage unit 193 stores a recipe in which a control program (software) for implementing various processes executed by the plasma processing apparatus 100 under the control of the process controller 191 and processing condition data are stored. Then, if necessary, an arbitrary recipe is called from the storage unit 193 by an instruction from the user interface 192 and executed by the process controller 191 so that the plasma processing apparatus 100 performs a desired process under the control of the process controller 191. In addition, recipes such as control programs and processing condition data may be stored in a computer storage medium that is readable by a computer or may be transmitted online at any time from other devices, for example, via a dedicated line. Examples of the computer storage medium include a hard disk, a CD, a flexible disk, and a semiconductor memory.

Figure 2:
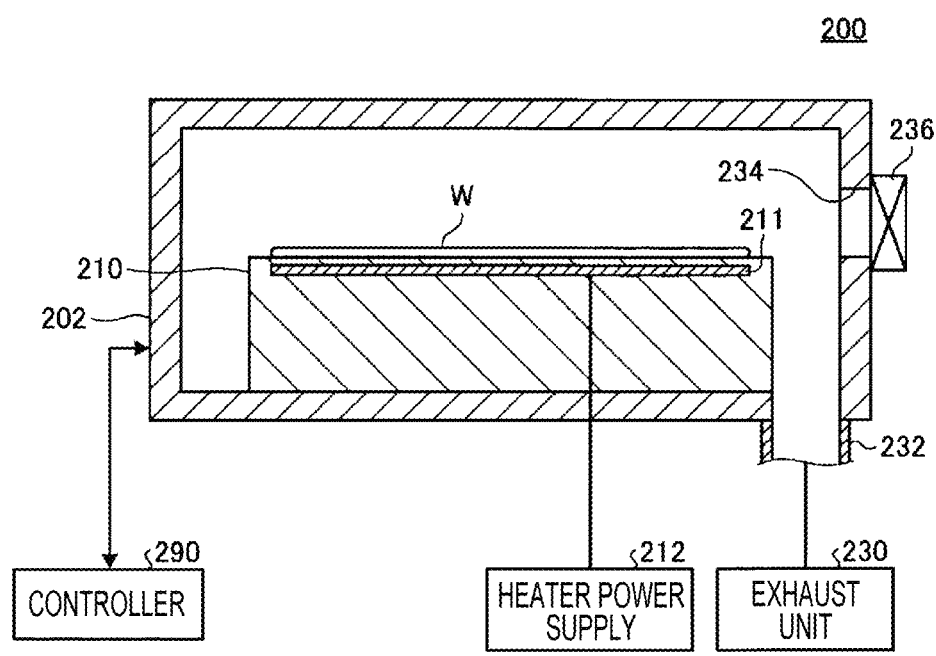
FIG. 2 is a diagram illustrating an example of a schematic configuration of a heating apparatus according to the embodiment.

Next, an example of the configuration of a heating apparatus according to the present embodiment will be described. FIG. 2 is a diagram illustrating an example of a schematic configuration of the heating apparatus according to the embodiment. In the present embodiment, the heating apparatus 200 is provided separately from the plasma processing apparatus 100 illustrated in FIG. 1, and the wafer W is transferred to the heating apparatus 200 and the plasma processing apparatus 100 by a transfer mechanism such as a transfer arm (not illustrated).

The heating apparatus 200 includes a processing chamber 202 that is formed in a tubular shape (e.g., a cylindrical shape) made of metal (e.g., aluminum).

A stage 210 for mounting the wafer W is provided at the bottom of the processing chamber 202. The stage 210 is formed in a columnar shape made of aluminum. The stage 210 is provided with a heater 211. The heater 211 is connected to a heater power supply 212 and generates heat by the electric power supplied from the heater power supply 212. The stage 210 controls the temperature of the wafer W by the heater 211. Although not illustrated, the stage 210 may be provided with various functions such as an electrostatic chuck, if necessary.

An exhaust unit 230 that exhausts the atmosphere in the processing chamber 202 is connected to the bottom of the processing chamber 202 via an exhaust pipe 232. The exhaust unit 230 includes, for example, a vacuum pump, and depressurizes the inside of the processing chamber 202 to a predetermined pressure. A wafer loading/unloading port 234 is formed on the side wall of the processing chamber 202. A gate valve 236 is provided at the wafer loading/unloading port 234. For example, when loading the wafer W, the gate valve 236 is opened, the wafer W is placed on the stage 210 in the processing chamber 202 by a transfer mechanism such as a transfer arm (not illustrated), and the gate valve 236 is closed to process the wafer W.

The heating apparatus 200 heats the wafer W placed on the stage 210 to a predetermined temperature by the heater 211.

The operation of the heating apparatus 200 having the above configuration is collectively controlled by the controller 290. The controller 290 is, for example, a computer, and includes a central processing unit (CPU), a random access memory (RAM), a read only memory (ROM), and an auxiliary storage device. The CPU operates based on the program stored in the ROM or the auxiliary storage device and the processing conditions of the plasma processing, and controls the operation of the entire apparatus. The controller 290 may be provided inside or outside the heating apparatus 200. When the controller 290 is provided externally, the controller 290 may control the heating apparatus 200 by a communication unit such as wired or wireless unit.

Next, the substrate processing method according to the present embodiment will be described.

In the manufacture of semiconductor devices, patterning is performed. In patterning, a mask having a pattern formed thereon is provided on the wafer W, and the wafer W is etched. The wafer W is patterned along the shape of the mask pattern. Therefore, it is expected that the pattern is controlled to a desired shape.

Therefore, in the present embodiment, the pattern is controlled to a desired state by performing the following substrate processing. FIGS. 3A to 3C are diagrams illustrating an example of a flow of substrate processing according to the embodiment. The wafer W is illustrated in FIG. 3A. The wafer W includes a base layer 10 and a mask disposed thereon. A pattern P is formed in the mask. In the present embodiment, the mask is made of $SiO_2$ film 11. In FIG. 3A, a convex portion having a tapered shape in which the width of the upper part is smaller than the width of the lower part, is formed on the $SiO_2$ film 11 as the pattern P.

In the substrate processing, a film forming process is performed to form a silicon-containing film on the wafer W provided with the mask. In the film forming process, a film of the same type as the mask may be formed. For example, when the $SiO_2$ film 11 is provided as a mask, a film 20 (here, the $SiO_2$ film) is formed on the wafer W by the chemical vapor deposition (CVD). For example, the plasma processing apparatus 100 supplies, for example, $SiCl_4$ gas and $O_2$ gas from the gas supply 120 to the processing chamber 102, and applies radio-frequency power from the radio-frequency power supply 150 to the antenna element 142 to generate plasma and form the $SiO_2$ film 20 on the wafer W. In the CVD, the $SiO_2$ film 20 is formed thicker toward the upper part.

As a result, as illustrated in FIG. 3B, the width of the upper part of the pattern P becomes about the same as the width of the lower part. However, the width of the pattern P is increased as a whole due to the film formation.

Therefore, a chemical removal (CR) processing for removing the film 20 (here, the $SiO_2$ film) is performed in the substrate processing. Details of the CR processing will be described later. The CR processing is isotropically removed (etched) substantially uniformly. As a result, as illustrated in FIG. 3C, the width between the patterns P may be returned to the same level as the initial width. An etching film such as a base may be etched using such a pattern P.

A method for forming a silicon-containing film in the film forming process is not limited to the CVD, and any method may be used as long as the silicon-containing film may be formed. For example, the film forming method may be a physical vapor deposition (PVD), a direct current superposition (DCS), an atomic layer deposition (ALD), an unsaturated ALD, or a quasi-ALD (QALD). For example, when a silicon-containing film is formed by the ALD, the plasma processing apparatus 100 supplies a raw material gas containing silicon (Si) from the gas supply 120 to the processing chamber 102 to adsorb the raw material gas on the wafer W. The amount of the raw material gas adsorbed on the wafer W increases and saturates with the supply time. The saturation referred to herein is a state where chemical adsorption proceeds on the outermost surface and chemical adsorption does not proceed any further, or a state where all the sites to be adsorbed are occupied and adsorption does not proceed. Next, the plasma processing apparatus 100 supplies the reaction gas from the gas supply 120 to the processing chamber 102, and applies radio-frequency power from the radio-frequency power supply 150 to the antenna element 142 to generate plasma. As a result, the reaction gas is activated, and the active species of the reaction gas modifies the raw material gas adsorbed on the wafer W to form a film. Examples of the raw material gas include tris(dimethylamino)silane (TDMAS) and bis(diethylamino)silane (BDEAS).

Examples of the reaction gas include an oxidizing gas such as oxygen ($O_2$) gas. The reaction gas (e.g., $O_2$ gas) is turned into plasma and supplied to the wafer W. When the film is formed by the ALD, the plasma processing apparatus 100 forms a thin film having a desired film thickness by repeating a plurality of cycles of alternately supplying the raw material gas and the reaction gas. In the ALD, since the amount of the raw material gas adsorbed on the wafer W is saturated, the film may be formed uniformly. The unsaturated ALD does not saturate the adsorption of the raw material gas, does not saturate the modification of the raw material gas adsorbed on the wafer W, or does not saturate the adsorption of the raw material gas and the modification of the raw material gas adsorbed on the wafer W. The unsaturated ALD may not be completely modified except when the raw material gas is not adsorbed to the entire surface. The QALD is an ALD in which a raw material gas is dissociated and adsorbed by plasma and modified by, for example, oxygen plasma to form a non-conformal film (having a non-uniform film thickness). The DCS is a film forming method in which electrode materials are sputtered to form a film on a substrate. For example, in the DCS, in a plasma processing apparatus, a negative DC voltage is applied to an upper electrode containing electrode materials to sputter the electrode materials and form a film on the substrate. The details of the DCS are disclosed, for example, in U.S. Patent Application Publication No. 2018/0151333.

The silicon-containing film has a film forming region and a film forming amount that vary depending on the film forming method. FIG. 4 is a diagram illustrating an example of a film forming region and a film forming amount for each film forming method according to the embodiment. FIG. 4 illustrates the amount of film formed by the ALD, CVD, QALD, and CVD+QALD+ALD. The CVD+QALD+ALD refers to the film formation performed by the CVD, QALD, and ALD, respectively. The horizontal axis of the graph in FIG. 4 is the depth of the pattern P from the surface. The vertical axis of the graph is the amount of film formed. The film formation amount is represented by a value obtained by standardizing the film formation amount on the upper surface of the pattern P as 1. The ALD is formed substantially uniformly to the bottom of the pattern P. In the CVD, the film is formed on the upper surface of the pattern P and the upper part of the side surface of the pattern P. In the QALD, the film is formed to the vicinity of the upper surface of the pattern P and the center of the side surface of the pattern P. Although a film formation is performed up to the bottom of the pattern P in the CVD+QALD+ALD, more film formation is performed toward the upper surface of the pattern P and the upper part of the side surface of the pattern P. The shape of the pattern P may be controlled by performing the film forming process and the CR processing of each film forming method.

FIGS. 5A to 5E are diagrams illustrating an example of a change in the shape of a pattern according to the embodiment. FIG. 5A illustrates the pattern P in the initial state. The pattern P in the initial state has a shape in which the width of the upper part and the width of the lower part are substantially the same and the side surfaces are vertical. FIG. 5B represents an example of the pattern P when the CR processing is performed on the pattern P in the initial state. In the CR processing, the etching amount at the upper part of the pattern P is slightly larger than the etching amount at the lower part of the pattern P. Therefore, by the CR processing, the pattern P has a tapered shape in which the width of the upper part is smaller than the width of the lower part. FIG. 5C represents an example of the pattern P when the CR processing and the CVD are performed on the pattern P in the initial state for 10 seconds. In the CVD, a film is formed on the upper part of the pattern P and the upper part of the side surface of the pattern P. Therefore, by performing the CR processing and the CVD for 10 seconds, the pattern P has a shape in which the width of the upper part and the width of the lower part are substantially the same and the side surfaces are vertical. FIG. 5D represents an example of the pattern P when the CR processing and the CVD are performed on the pattern P in the initial state for 20 seconds. By performing the CR processing and the CVD for 20 seconds, the pattern P has an inverted tapered shape in which the width of the upper part is larger than the width of the lower part. FIG. 5E represents an example of the pattern P when the CR processing and the CVD are performed on the pattern P in the initial state for 30 seconds. By performing the CR processing and the CVD for 30 seconds, the pattern P has an inverted tapered shape in which the width of the upper part is larger than that in FIG. 5D. An etching film such as a base may be etched using such a pattern P.

Figure 6:
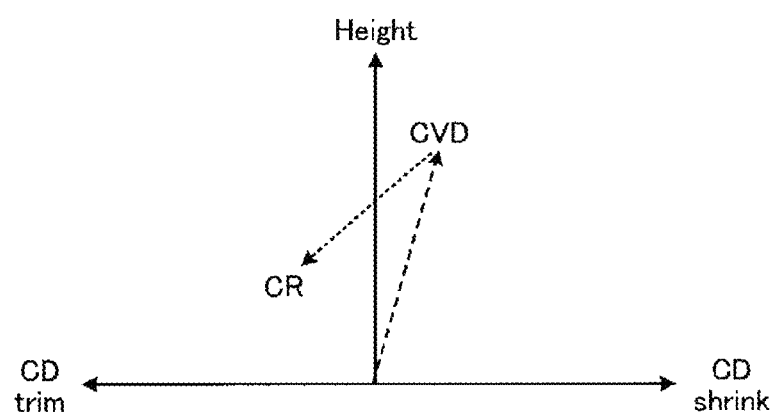
FIG. 6 is a diagram illustrating an example of a change in the shape of a pattern when the chemical vapor deposition (CVD) and chemical removal (CR) processing according to the embodiment is performed.

FIG. 6 is a diagram illustrating an example of a change in the shape of the pattern when the CVD and the CR processing according to the embodiment are performed. As illustrated in FIG. 6, when the CVD is performed, the width (CD) and height of the pattern P increase. After that, when the CR processing is performed, the width and height of the pattern P decrease, but the rate of change of the width and height is different from that of the CVD. Therefore, the height and width of the pattern P may be controlled by changing the time for performing the CVD and the etching amount in the CR processing. An etching film such as a base may be etched using such a pattern P.

Figures 7A, 7B:
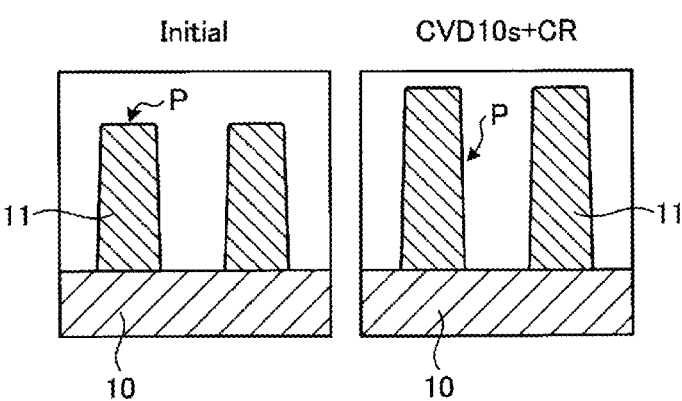
FIGS. 7A and 7B are diagrams illustrating an example of a change in the shape of a pattern when the CVD and the CR processing according to the embodiment is performed.

FIGS. 7A and 7B are diagrams illustrating an example of a change in the shape of a pattern when the CVD and the CR processing according to the embodiment are performed. FIG. 7A illustrates the pattern P in the initial state. The pattern P in the initial state has a shape in which the width of the upper part and the width of the lower part are substantially the same and the side surfaces are vertical. FIG. 7B illustrates an example of the pattern P when the CR processing and the CVD are performed on the pattern P in the initial state for 10 seconds. When the CR processing and the CVD are performed for 10 seconds, the height of the pattern P increases at a state where the width of the upper part and the width of the lower part are substantially the same as those of the initial state.

As described above, in the substrate processing according to the present embodiment, the shape of the pattern P may be controlled by performing the film forming process and the CR process.

Next, the chemical removal (CR) processing according to the present embodiment will be described. FIGS. 8A to 8D are diagrams illustrating an example of a flow of the CR processing according to the embodiment. In the wafer W illustrated in FIG. 8A, a $SiO_2$ film is provided on the base layer 10.

First, a reaction layer is formed by plasma on the surface layer of the wafer W provided with the $SiO_2$ film. For example, the plasma processing apparatus 100 introduces various gases used for CR processing, such as $NF_3$ gas, $NH_3$ gas, and Ar gas, from the gas supply 120 to generate plasma. As a result, $NH_xF_y$ is generated as illustrated in FIG. 8A. For example, $NH_xF_y$ such as $NH_4F$ and $NH_4 \cdot HF$ is generated by the following reaction.

The generated $NH_4F$ and $NH_4 \cdot HF$ react with the $SiO_2$ film as follows, and as illustrated in FIG. 8B, $(NH_4)_2SiF_6$ (ammonium fluorosilicate) is formed as a reaction layer. Hereinafter, $(NH_4)_2SiF_6$ is also referred to as "AFS." In the CR processing, AFS may be formed only by supplying gas. For example, AFS may be formed by supplying HF gas and $NH_3$ gas. When AFS is formed into a film using plasma, the reaction rate of AFS is improved. When the film is formed without using plasma, the damage of the film may be reduced.

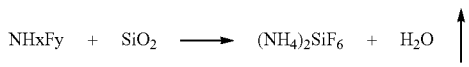

AFS sublimates when the temperature rises above 100° C. Therefore, when forming the reaction layer, the wafer W is controlled to a predetermined temperature of 100° C. or lower. For example, the plasma processing apparatus 100 controls the wafer W to a predetermined temperature of 100° C. or lower by controlling the electric power supplied from the heater power supply 112 to the heater 111 and controlling an amount of heat generated by the heater 111.

Next, energy is applied to the wafer W to remove the reaction layer. The reaction layer may be removed by applying energy to the reaction layer by, for example, electron beam, plasma, heat, or microwave. For example, as illustrated in FIG. 8C, the wafer W is heated to remove the reaction layer. In the present embodiment, the wafer W is heated to a predetermined temperature of 100° C. or higher (e.g., 300° C.). As a result, the following reaction occurs and $(NH_4)_2SiF_6$ is sublimated. As a result, the film (e.g., $SiO_2$ film 20) is removed from the wafer W. The reaction layer may be removed by applying energy by electron beam, plasma, or microwave.

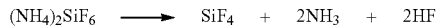

Here, when the wafer W is heated to, for example, 300° C. by the plasma processing apparatus 100, the temperature of the stage 110 also rises, and it takes a long time until the process of forming AFS on the next wafer W may be performed. Therefore, the wafer W after forming the AFS is transferred to the heating apparatus 200, and the wafer W is heated to a predetermined temperature of 100° C. or higher (e.g., 300° C.) by the heating apparatus 200. In this way, by performing the substrate processing by the plasma processing apparatus 100 and the heating apparatus 200, respectively, the time for raising and lowering the temperature between the processes may be reduced. The productivity of substrate processing may be improved as a whole. In the present embodiment, the case where the substrate processing is performed by the plasma processing apparatus 100 and the heating apparatus 200 will be described as an example, but the present disclosure is not limited thereto. For example, the wafer W may be heated by the plasma processing apparatus 100 to remove the reaction layer. As a result, the substrate may be processed in a single plasma processing chamber 102.

The CR processing may remove $SiO_2$ at a higher etching rate than the etching rate of Si or SiN. FIG. 9 is a diagram illustrating an example of the etching amount by the CR processing according to the embodiment. FIG. 9 represents changes in the etching amounts of Si, SiN, and $SiO_2$ when the plasma processing time for generating plasma is changed while introducing gases such as $NF_3$ gas and $NH_3$ gas. As illustrated in FIG. 9, with the CR processing, $SiO_2$ may be removed at a higher etching rate than the etching rate of Si or SiN.

Figure 10:
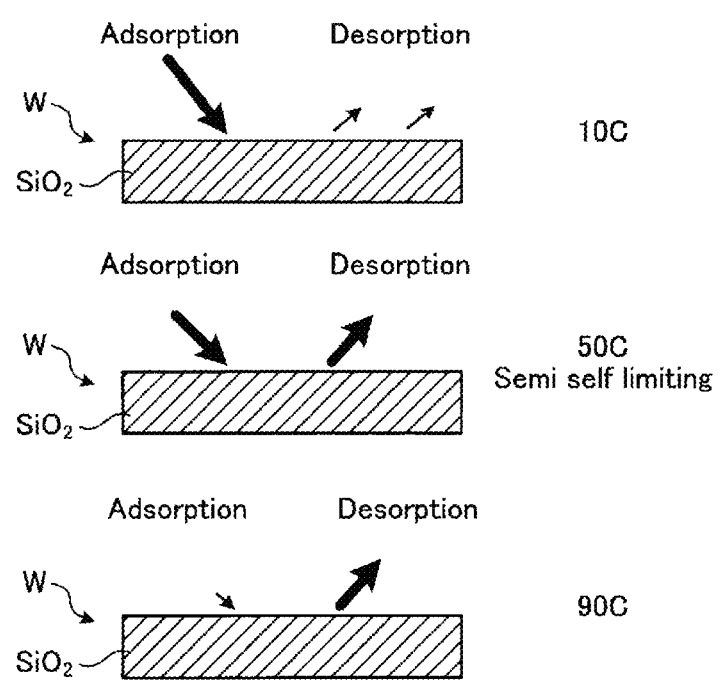
FIG. 10 is a diagram illustrating changes in the amount of adsorption and the amount of desorption depending on changes in the temperature of a wafer according to the embodiment.

In the CR processing, the thickness of the formed reaction layer differs depending on the temperature of the wafer W when the processing gas is introduced and plasma is generated to form the reaction layer, and the amount of the removed $SiO_2$ film changes. FIG. 10 is a diagram illustrating changes in an amount of adsorption and an amount of desorption due to changes in the temperature of the wafer according to the embodiment. $NH_4F$ and $NH_4 \cdot HF$ adsorb and desorb on the surface of the $SiO_2$ film. The adsorption amount and desorption amount of $NH_4F$ and $NH_4 \cdot HF$ vary depending on the temperature of the wafer W. For example, when the temperature of the wafer W is 10° C., the adsorption amount is great and the desorption amount is small. When the temperature of the wafer W is 50° C., the adsorption amount and the desorption amount are substantially the same. When the temperature of the wafer W is 90° C., the adsorption amount is small and the desorption amount is great.

Figure 11:
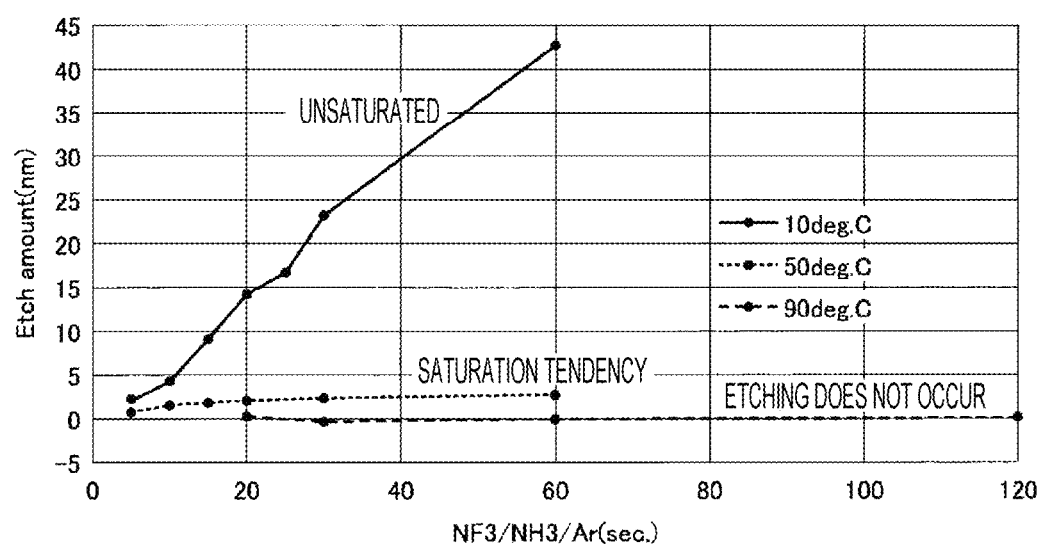
FIG. 11 is a diagram illustrating an example of a change in the etching amount depending on changes in the temperature of a wafer according to the embodiment.

FIG. 11 is a diagram illustrating an example of a change in the etching amount due to changes in the temperature of a wafer according to the embodiment. FIG. 11 represents a change in the etching amount of the $SiO_2$ film with respect to the processing time for forming the reaction layer when the temperature of the wafer W is 10° C., 50° C., and 90° C., respectively. When the temperature of the wafer W is 10° C., the etching amount of the $SiO_2$ film increases as the processing time becomes longer. Meanwhile, when the temperature of the wafer W is 90° C., etching hardly occurs, and the etching amount of the $SiO_2$ film stays around zero even when the processing time becomes longer.

When the temperature of the wafer W is 50° C., the etching amount of the $SiO_2$ film increases slightly according to the processing time when the processing time becomes shorter, but the etching amount saturates when the processing time becomes longer. In the example of FIG. 11, when the temperature of the wafer W is 50° C., the etching amount is saturated after the processing time is 40 seconds.

Therefore, in the CR processing, the amount of the removed $SiO_2$ film may be controlled by controlling the temperature of the wafer W when forming the reaction layer.

Further, in the CR processing, when the pattern P formed on the wafer W has density, the etching amount of the pattern P may change according to the density of the pattern P even when the same processing is performed.

Figure 12:
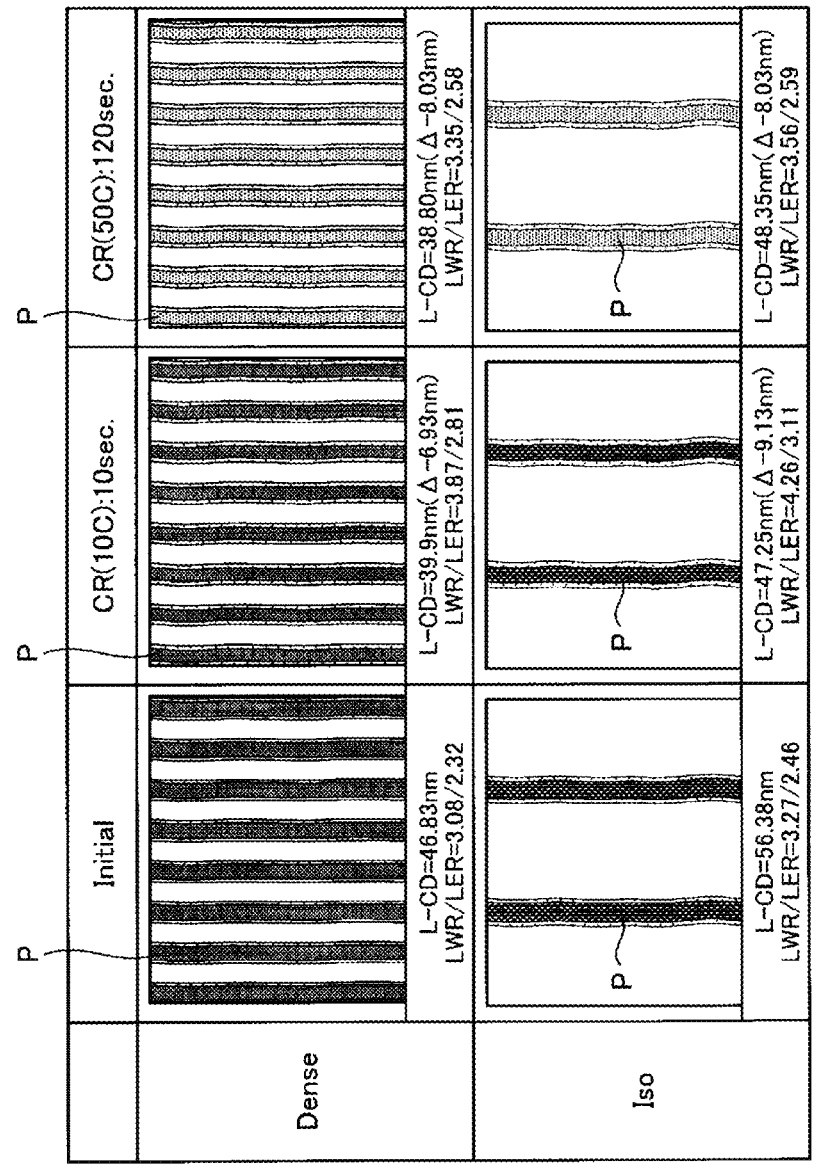
FIG. 12 is a diagram illustrating an example of a pattern change in the CR processing depending on the density of the pattern according to the embodiment.

FIG. 12 is a diagram illustrating an example of a pattern change in the CR processing due to the density of the pattern according to the embodiment. FIG. 12 represents the changes in the densely formed (dense) line-shaped pattern P and the changes in the coarsely formed (iso) line-shaped pattern P side by side. In the "initial" column of FIG. 12, the initial shape of the line-shaped pattern P is illustrated. The width of the line-shaped pattern P is indicated as a line critical dimension (L-CD). The line width roughness (LWR) and the line edge roughness (LER) of the line-shaped pattern P are also illustrated.

The "CR(1° C.):10 sec" column of FIG. 12 represents the changes in the shape of the pattern P occurring when the CR processing is performed while the temperature of the wafer W at the processing time for forming the reaction layer is 10° C. and the processing time is 10 seconds. In the "CR(10C):10 sec" column, the densely formed pattern P has the L-CD change of −6.93 nm from the initial shape. In the coarsely formed pattern P, the L-CD changes by −9.13 nm from the initial shape. In the "CR(10C):10 sec" column, a difference of −2.2 nm occurs in the change in L-CD between the densely formed pattern P and the coarsely formed pattern P.

The "CR(50C):120 sec" column of FIG. 12 represents the changes in the shape of the pattern P occurring when the CR processing is performed while the temperature of the wafer W at the processing time for forming the reaction layer is 50° C. and the processing time is 120 seconds. In the "CR(50C):120 sec" column, the densely formed pattern P has the L-CD change of −8.03 nm from the initial shape. In the coarsely formed pattern P, the L-CD changes by −8.03 nm from the initial shape. In the "CR(50C):120 sec" column, no difference occurs in the change in L-CD between the densely formed pattern P and the coarsely formed pattern P.

Figure 13:
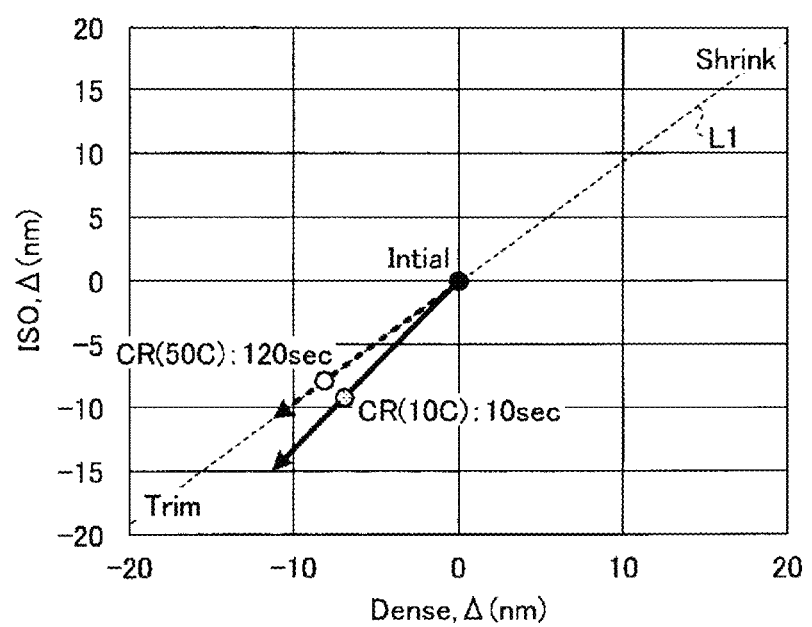
FIG. 13 is a diagram illustrating an example of a pattern change in the CR processing depending on the density of the pattern according to the embodiment.

FIG. 13 is a diagram illustrating an example of a pattern change in the CR processing due to the density of the pattern according to the embodiment. In FIG. 13, for the "CR(1° C.):10 sec" and "CR(50C):120 sec" columns of FIG. 12, the change (Δ) of L-CD is represented from the initial shapes of the densely formed (dense) line-shaped pattern P and the coarsely formed (iso) line-shaped pattern P. In the "CR (50C):120 sec" column, since L-CDs of the densely formed pattern P and the coarsely formed pattern P change equally, the change (Δ) of the L-CD decreases along the dashed line L1 in a direct proportion of 1:1. In the "CR(1° C.):10 sec" column, since there is a difference in the change in L-CD between the densely formed pattern P and the coarsely formed pattern P, the pattern P deviates from the dashed line L1.

Further, in the CR processing, when the pattern P formed on the SiO$_2$ film 11 of the wafer W has density, the etching amount of the pattern P may change depending on the density of the pattern P even when the same processing is performed. For example, in the CR processing of the "CR(1° C.):10 sec" column described above, the coarsely formed pattern P is etched more than the densely formed pattern P, and thus, the coarsely formed pattern P has a larger change in L-CD than the densely formed pattern P. Further, in the CR processing, the change amount in the etching amount of the pattern P also varies according to the temperature of the wafer W when forming the reaction layer.

In the CR processing, the etching amount of the pattern P changes depending on the state of the particles and the wafer W. Therefore, in the CR processing, preprocessing such as heating and plasma processing may be performed in order to remove particles and adjust the state of the wafer W.

Figure 14:
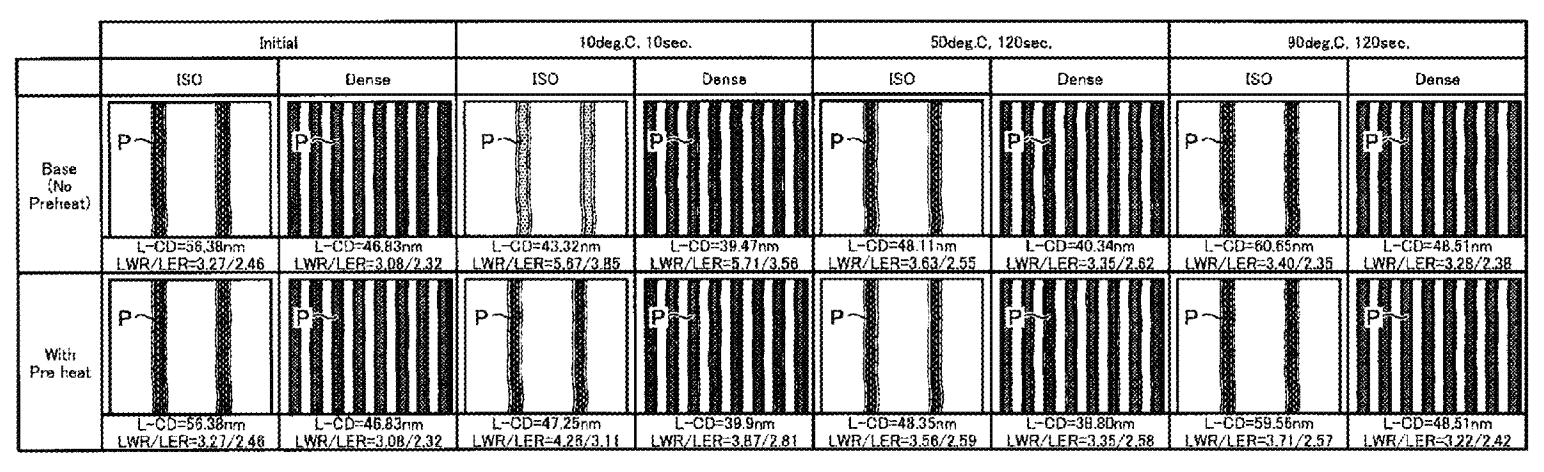

FIG. 14 is a diagram illustrating an example of a pattern change in the CR processing depending on the presence or absence of preheating according to the embodiment. The "Base" column of FIG. 14 represents a case where the CR processing is performed without performing preheating. The "With Preheat" column represents a case where the CR processing is performed after the preheating for heating the wafer W to 300° C. is performed. The "Initial" column of FIG. 12 represents the initial shapes of the densely formed (dense) line-shaped pattern P and the coarsely formed (iso) line-shaped pattern P. The width of the line-shaped pattern P is indicated as L-CD. Further, the LWR and LER of the line-shaped pattern P are illustrated.

The "10 deg. C., 10 sec" column of FIG. 14 represents the shape of the pattern P, L-CD, LWR, and LER occurring when the CR processing is performed while the temperature of the wafer W at the processing time for forming the reaction layer is 10° C. and the processing time is 10 seconds. In the "10 deg. C., 10 sec" column, the shape of the pattern P, L-CD, LWR, and LER are illustrated when the CR processing is performed on the pattern P of the initial shape while the temperature of the wafer W at the processing time for forming the reaction layer is 50° C. and the processing time is 120 seconds. In the "90 deg. C., 120 sec" column, the shape of the pattern P, L-CD, LWR, and LER are illustrated when the CR processing is performed on the pattern P of the initial shape while the temperature of the wafer W at the processing time for forming the reaction layer is 90° C. and the processing time is 120 seconds.

Figure 15:
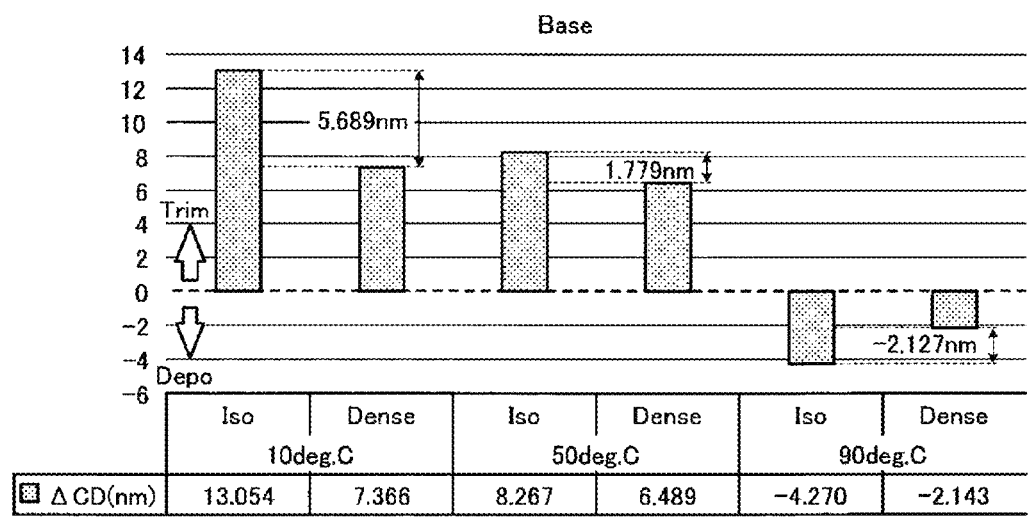
FIG. 15 is a diagram illustrating an example of a change in the line critical dimension (L-CD) in the CR processing without performing preheating according to the embodiment.

FIG. 15 is a diagram illustrating an example of a change in L-CD in the CR processing without performing preheating according to the embodiment. The lower part of FIG. 15 illustrates the change in L-CD (ΔCD) from the initial shapes of the densely formed (dense) line-shaped pattern P and the coarsely formed (iso) line-shaped pattern P when the CR processing is performed without performing preheating, as illustrated in the "Base" column of FIG. 14. Further, the graph of FIG. 15 represents the difference between the change in L-CD of the densely formed pattern P and the coarsely formed pattern P, and the change in L-CD. For example, when the temperature of the wafer W at the processing time is 10° C., the ΔCD of the coarsely formed pattern P is 13.054 nm, the ΔCD of the densely formed pattern P is 7.366 nm, and the difference in ΔCD is 5.689 nm. Further, when the temperature of the wafer W in the processing time is 50° C., the ΔCD of the coarsely formed pattern P is 8.267 nm, the ΔCD of the densely formed pattern P is 6.489 nm, and the difference in ΔCD is 1.779 nm. When the temperature of the wafer W at the processing time is 90° C., the ΔCD of the coarsely formed pattern P is −4.270 nm, the ΔCD of the densely formed pattern P is −2.143 nm, and the difference in ΔCD is −2.127 nm. Here, when the temperature of the wafer W at the processing time is 90° C., ΔCD is set to a negative value, and the width of the pattern P is slightly increased.

Figure 16:
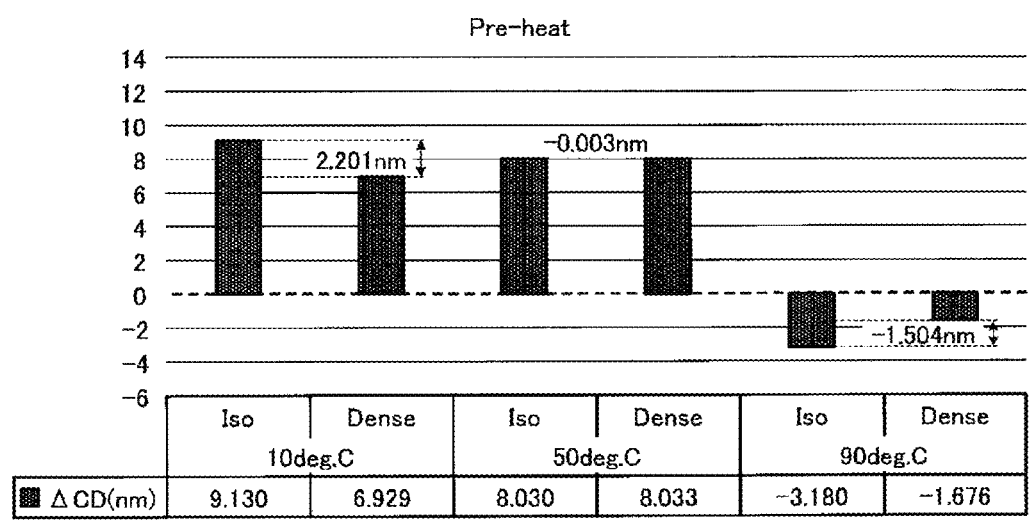
FIG. 16 is a diagram illustrating an example of a change in the L-CD in the CR processing without performing preheating according to the embodiment.

FIG. 16 is a diagram illustrating an example of a change in L-CD in the CR processing in which the preheating according to the embodiment is performed. The lower part of FIG. 16 illustrates the change in L-CD (ΔCD) from the initial shapes of the densely formed (dense) line-shaped pattern P and the coarsely formed (iso) line-shaped pattern P when the CR processing is performed after preheating, as illustrated in the "With Preheat" column of FIG. 14. Further, the graph of FIG. 16 represents the difference between the change in L-CD of the densely formed pattern P and the coarsely formed pattern P, and the change in L-CD. For example, when the temperature of the wafer W at the processing time is 10° C., the ΔCD of the coarsely formed pattern P is 9.130 nm, the ΔCD of the densely formed pattern P is 6.929 nm, and the difference in ΔCD is 2.201 nm. Further, when the temperature of the wafer W at the processing time is 50° C., the ΔCD of the coarsely formed pattern P is 8.030 nm, the ΔCD of the densely formed pattern P is 8.033 nm, and the difference in ΔCD is −0.003 nm. When the temperature of the wafer W at the processing time is 90° C., the ΔCD of the coarsely formed pattern P is −3.180 nm, the ΔCD of the densely formed pattern P is −1.676 nm, and the difference in ΔCD is −1.504 nm.

As described above, in the CR processing, the change amount in L-CD of the densely formed pattern P and the coarsely formed pattern P varies depending on the temperature of the wafer W when forming the reaction layer. Further, in the CR processing, the difference in the change amount in L-CD between the densely formed pattern P and the coarsely formed pattern P varies depending on the temperature of the wafer W when forming the reaction layer. For example, in the CR processing, taking the temperature around 50° C. as a boundary, as the temperature becomes lower, the change in L-CD becomes larger in the coarsely formed pattern P than in the densely formed pattern P. Further, in the CR processing, taking the temperature around 50° C. as a boundary, as the temperature becomes higher, the change in L-CD between the densely formed pattern P and the coarsely formed pattern P becomes about the same. Therefore, in the CR processing, the widths of the densely formed pattern P and the coarsely formed pattern P, respectively, may be controlled by controlling the temperature of the wafer W when forming the reaction layer.

In the CR processing, when preheating is performed, the difference in ΔCD between the densely formed pattern P and the coarsely formed pattern P becomes smaller. However, by performing the preheating, the ΔCD becomes stable and the error for each CR processing becomes smaller, so that the pattern P may be changed with high accuracy.

In this way, with the CR processing, the widths of the densely formed pattern P and the coarsely formed pattern P, respectively, may be controlled. As described above, in the substrate processing according to the present embodiment, the widths of the densely formed pattern P and the coarsely formed pattern P may be controlled by performing the film forming process and the CR process.

FIG. 17 is a diagram illustrating an example of a change in the width of the pattern due to the density of the pattern according to the embodiment. The "Initial" column of FIG. 17 represents the initial shapes of the densely formed (dense) line-shaped pattern P and the coarsely formed (iso) line-shaped pattern P. The width of the line-shaped pattern P is indicated as an L-CD. Further, the LWR and LER of the line-shaped pattern P are illustrated.

The "ALD" column of FIG. 17 represents a change in the shape of the pattern P when the ALD is performed for 30 cycles. In the "ALD" column, the densely formed pattern P has the L-CD changed by 5.42 nm from the initial shape. In the coarsely formed pattern P, the L-CD changes by 4.11 nm from the initial shape. In the "ALD" column, a difference of −1.31 nm occurs in the change in L-CD between the densely formed pattern P and the coarsely formed pattern P.

The "ALD+CR" column of FIG. 17 illustrates the change in the shape of the pattern P occurring when the CR processing is performed while the processing time for forming the reaction layer is 10 seconds and the temperature of the wafer W at the processing time is 10° C. after the ALD is performed for 30 cycles. In the "ALD+CR" column, the densely formed pattern P has an L-CD changed by −3.86 nm from the initial shape. In the coarsely formed pattern P, the L-CD changes by −17.64 nm from the initial shape. In the "ALD+CR" column, a difference of 13.78 nm occurs in the change in L-CD between the densely formed pattern P and the coarsely formed pattern P. The "ALD+CR" column may significantly reduce the L-CD of the coarsely formed pattern P while suppressing the decrease in the L-CD of the densely formed pattern P.

The "ALD+CR120s" column of FIG. 17 illustrates the change in the shape of the pattern P occurring when the CR processing is performed while the processing time for forming the reaction layer is 120 seconds and the temperature of the wafer W at the processing time is 50° C. after the ALD is performed for 30 cycles. In the "ALD+CR120s" column, the densely formed pattern P has an L-CD changed by −2.68 nm from the initial shape. In the coarsely formed pattern P, the L-CD changes by −4.58 nm from the initial shape. In the "ALD+CR120s" column, a difference of 1.91 nm occurs in the change in L-CD between the densely formed pattern P and the coarsely formed pattern P. In the "ALD+CR120s" column, the change in L-CD of the densely formed pattern P and the coarsely formed pattern P may be made about the same.

Figure 18:
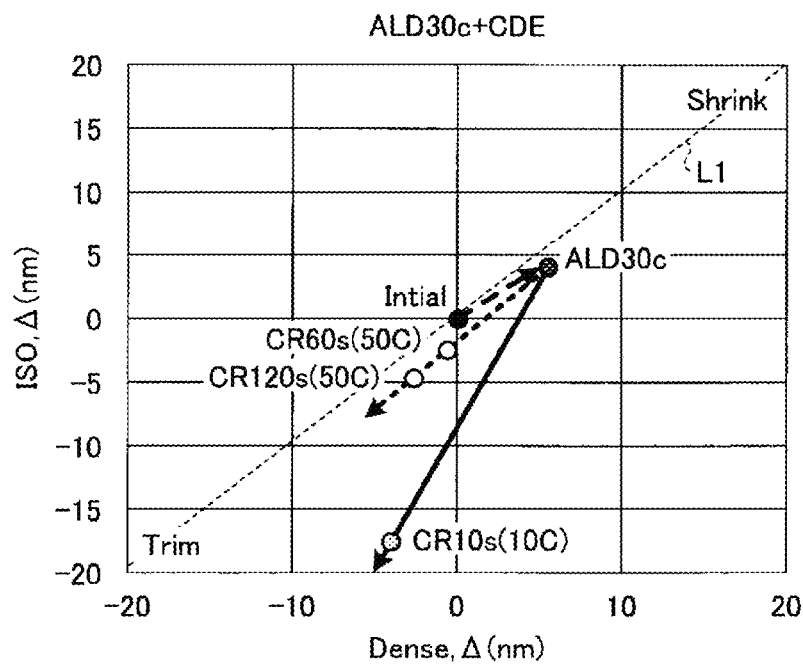
FIG. 18 is a diagram illustrating an example of a pattern change depending on the density of the pattern according to the embodiment.

FIG. 18 is a diagram illustrating an example of a change in the width of the pattern due to the density of the pattern according to the embodiment. FIG. 18 represents the change (Δ) of L-CD from the initial shapes of the densely formed (dense) line-shaped pattern P and the coarsely formed (iso) line-shaped pattern P.

The "ALD30c" column represents the change (Δ) in L-CD of the densely formed pattern P and the coarsely formed pattern P when the ALD is performed for 30 cycles. In the ALD, since the film is formed substantially uniformly, the L-CDs of the densely formed pattern P and the coarsely formed pattern P increase along the dashed line L1 which represents the change (Δ) of the L-CD in a direct proportion of 1:1.

FIG. 18 illustrates the change (Δ) in L-CD when "CR60s (50C)," "CR120s(50C)," and "CR10s(10C)," respectively, are performed after "ALD30c." "CR60s(50C)" indicates a case where the CR processing is performed while the processing time for forming the reaction layer is 60 seconds and the temperature of the wafer W at the processing time is 50° C. "CR120s(50C)" indicates a case where the CR processing is performed while the processing time for forming the reaction layer is 120 seconds and the temperature of the wafer W at the processing time is 50° C. "CR10s(10C)" indicates a case where the CR processing is performed while the processing time for forming the reaction layer is 10 seconds and the temperature of the wafer W at the processing time is 10° C.

In "CR60s(50C)" and "CR120s(50C)," the L-CDs of the densely formed pattern P and the coarsely formed pattern P decrease along the dashed line L1.

In "CR10s(1° C.)," the change in L-CD is larger in the coarsely formed pattern P than in the densely formed pattern P.

Figure 19:
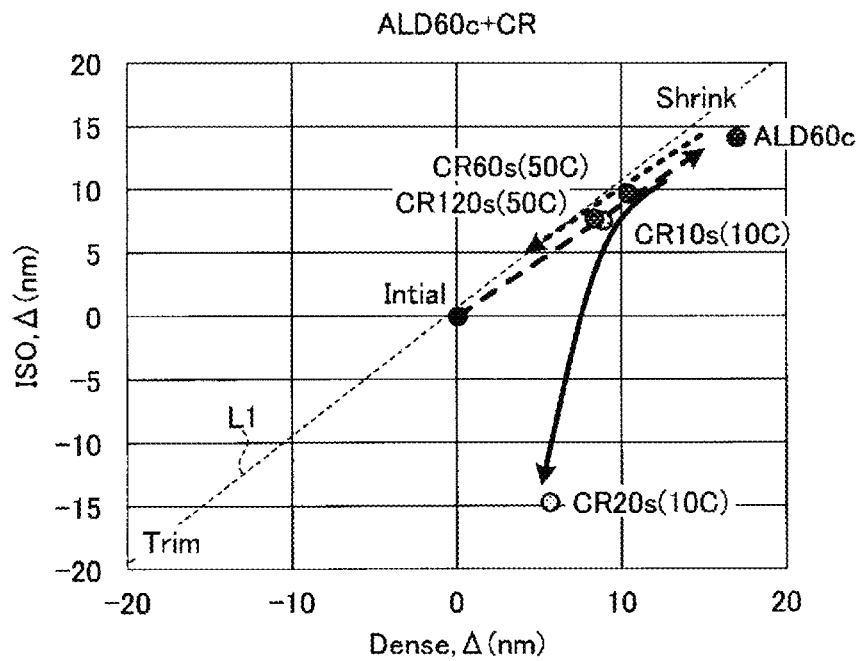
FIG. 19 is a diagram illustrating another example of a pattern change depending on the density of the pattern according to the embodiment.

FIG. 19 is a diagram illustrating another example of a pattern change due to the density of the pattern according to the embodiment. FIG. 19 represents the change (Δ) of L-CD from the initial shapes of the densely formed (dense) line-shaped pattern P and the coarsely formed (iso) line-shaped pattern P.

"ALD60c" represents the change (Δ) in L-CD of the densely formed pattern P and the coarsely formed pattern P when the ALD is performed for 60 cycles. In the ALD, the L-CDs of the densely formed pattern P and the coarsely formed pattern P decrease along the dashed line L1.

FIG. 19 illustrates the change (Δ) of the L-CD when "CR60s(50C)," "CR120s(50C)," "CR10s(1° C.)," and "CR20s(1° C.)," respectively, are performed after "ALD60c." "CR60s(50C)," "CR120s(50C)," and "CR10s (10C)" indicate a case where the same CR processing described with reference to FIG. 18 is performed. "CR20s (10C)" indicates a case where the CR processing is performed while the processing time for forming the reaction layer is 20 seconds and the temperature of the wafer W at the processing time is 10° C.

In "CR10s(10C)," the change in the coarsely formed pattern P is larger than that in the densely formed pattern P as compared with the case of "CR10s(10C)."

By performing the film forming process and the CR processing in this way, the widths of the densely formed pattern P and the coarsely formed pattern P, respectively, may be controlled.

Further, the LWR and LER of the line-shaped pattern P are improved by performing the film forming process and the CR processing.

Figure 20A:
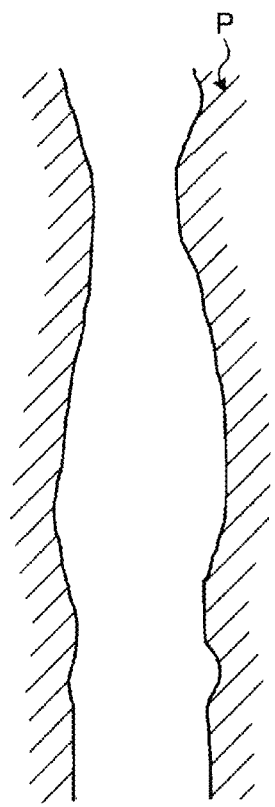
FIGS. 20A to 20C are diagrams illustrating improvements in the line width roughness (LWR) and the line edge roughness (LER) of a line-shaped pattern according to the embodiment.
Figure 20B:
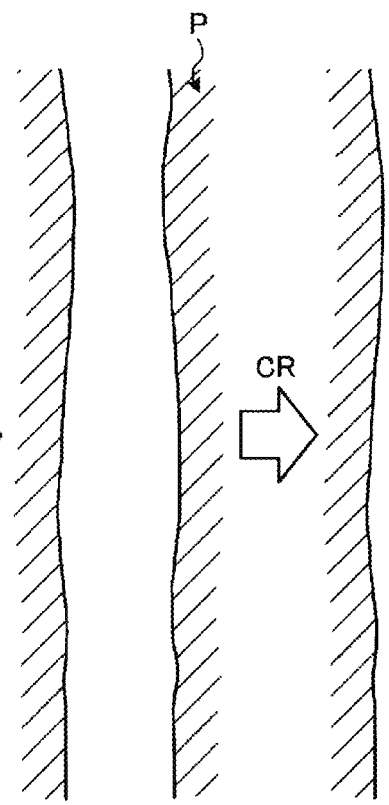
Figure 20C:
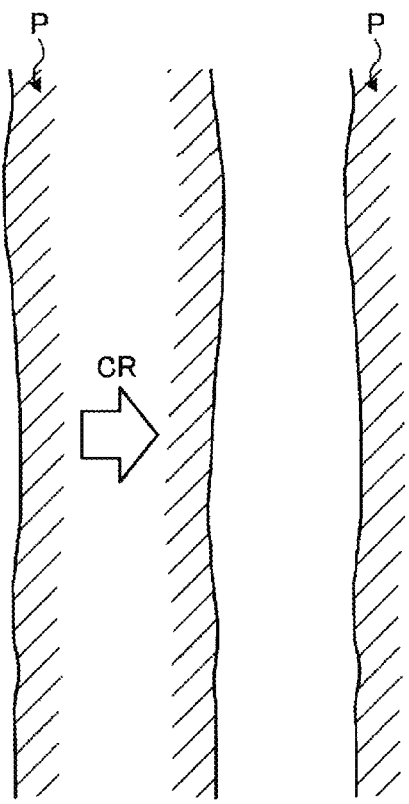

FIGS. 20A to 20C are diagrams illustrating improvement of LWR and LER of the line-shaped pattern according to the embodiment. FIG. 20A represents a line-shaped pattern P. In the film forming process, a film of the same type as the pattern P is formed. For example, when the pattern P is formed on the SiO₂ film, SiO₂ is formed by the CVD in the film forming process. In the CVD, a large amount of film is formed in a place where the width between the patterns P is wide, and a small amount of film is formed in a place where the width between the patterns P is narrow. As a result, as illustrated in FIG. 20B, the unevenness on the side surface of the line-shaped pattern P is reduced. However, the width between the patterns P becomes narrower due to the film formation. Therefore, the CR processing is performed on the line-shaped pattern P. For example, the CR processing is performed while the temperature of the wafer W when forming the reaction layer is set to 50° C. The CR processing is isotropically etched. As a result, as illustrated in FIG. 20C, the width between the patterns P may be returned to the same level as the initial width. By repeatedly performing the film forming process and the CR processing illustrated in FIGS. 20A to 20C, the LWR and LER of the line-shaped pattern P are improved.

Figure 21:
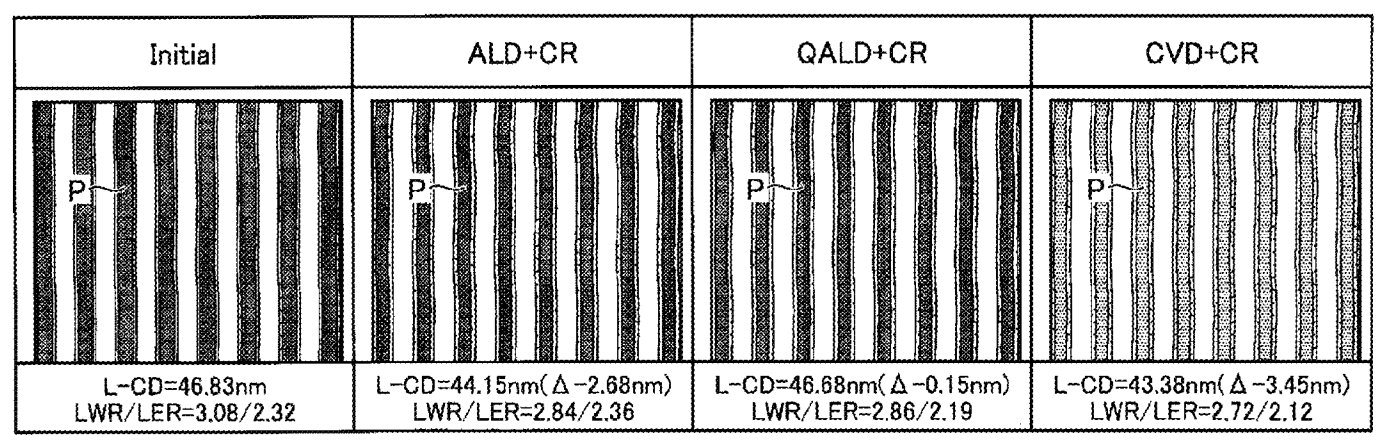

FIG. 21 is a diagram illustrating an example of changes in LWR and LER caused by performing the film forming process and the CR processing according to the embodiment. In FIG. 21, the initial shape of the line-shaped pattern P is illustrated. The width of the line-shaped pattern P is indicated as L-CD. Further, the LWR and LER of the line-shaped pattern P are illustrated.

FIG. 21 illustrates changes in the shape of the pattern P when any of the ALD, QALD, and CVD is combined with the CR processing and performed once as the film forming process, and L-CD, LWR, and LER. The LWR and LER are decreased and improved in any of the ALD, QALD, and CVD. Although the values of the LWR and LER improved by performing the film forming process and the CR processing once are small, the LWR and LER may be improved by repeatedly performing the film forming process and the CR processing.

In the substrate processing according to the present embodiment, descriptions have been made on, as an example, a case where a silicon-containing film such as SiO₂ is formed on the wafer W as a mask and a silicon-containing film (SiO₂) of the same type is formed on the silicon-containing film. However, the present disclosure is not limited thereto. The mask is not limited to the SiO₂ film and may be a hard mask such as a SiN film. For example, the wafer W may be provided with a silicon-containing film such as SiN as a mask, and a pattern P may be formed on the silicon-containing film. Further, in the film forming process, a different type of silicon-containing film such as SiO₂ may be formed on the silicon-containing film such as SiN. In the substrate processing, a film such as a silicon-containing film or an organic film may be formed.

Further, in the substrate processing according to the present embodiment, a silicon-containing film such as SiO₂ or SiN, or a film such as an organic film may be formed on the mask.

As described above, since the shape of the pattern P may be controlled by the substrate processing according to the present embodiment, the shape of the film to be etched may be controlled by using the pattern P as a mask and performing etching.

Figure 22:
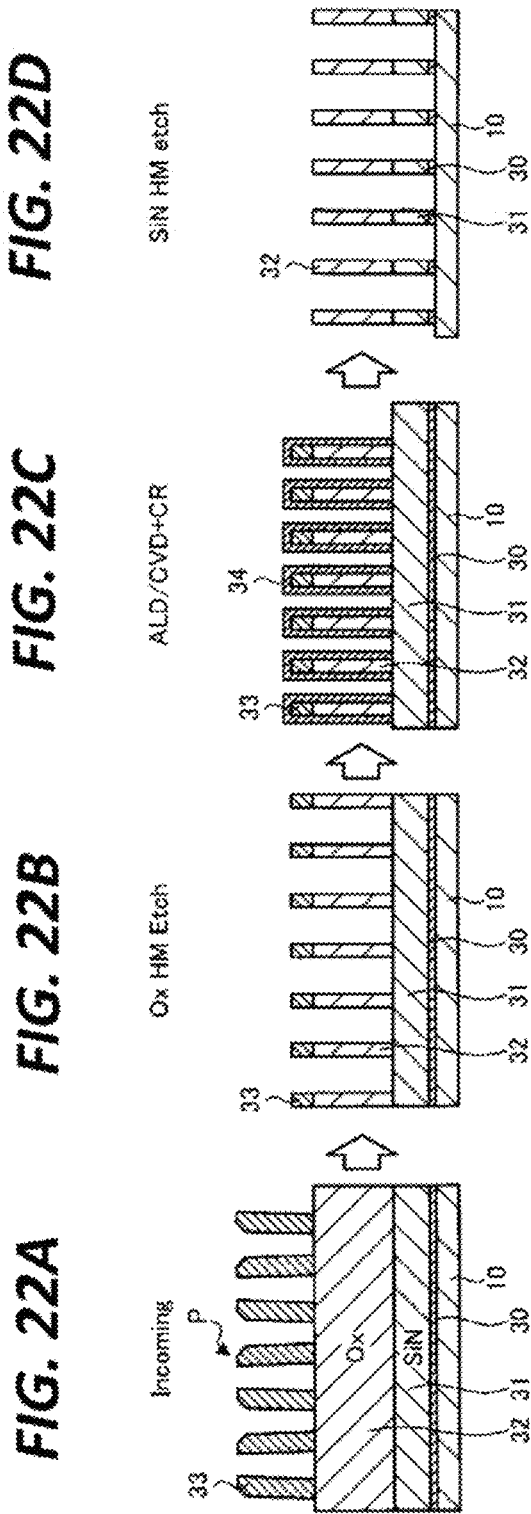
FIGS. 22A to 22D are diagrams illustrating an example of an etching process using a substrate processing according to the embodiment.

FIGS. 22A to 22D are diagrams illustrating an example of an etching process using a substrate processing according to the embodiment. As illustrated in FIG. 22A, a Pad-Ox layer 30 is formed on the base layer 10 in the wafer W. The Pad-Ox layer 30 is, for example, a SiO₂ film as a stop layer. A SiN layer 31 is formed on the Pad-Ox layer 30. A silicon oxide layer (Ox) 32 is formed on the SiN layer 31. A SiN layer 33 is formed on the silicon oxide layer (Ox) 32. A pattern P is formed on the SiN layer 33.

For example, as illustrated in FIG. 22B, the silicon oxide layer 32 of the wafer W is etched using the SiN layer 33 as a mask.

Then, the film forming process and the CR processing according to the embodiment are performed. In FIG. 22C, a silicon-containing film 34 such as SiO₂ is formed by the film forming process. Thus, the shapes of the silicon oxide layer 32 and the SiN layer 33 used as masks for etching the Pad-Ox layer 30 and the SiN layer 31 may be controlled. Further, the LWR and LER of the pattern P may be improved.

Then, as illustrated in FIG. 22D, the Pad-Ox layer 30 and the SiN layer 31 of the wafer W are etched by using the silicon oxide layer 32 and the SiN layer 33 on which the pattern P is formed, as masks. Thus, the pattern P formed on the Pad-Ox layer 30 and the SiN layer 31 may be controlled by the substrate processing according to the embodiment.

Figure 23:
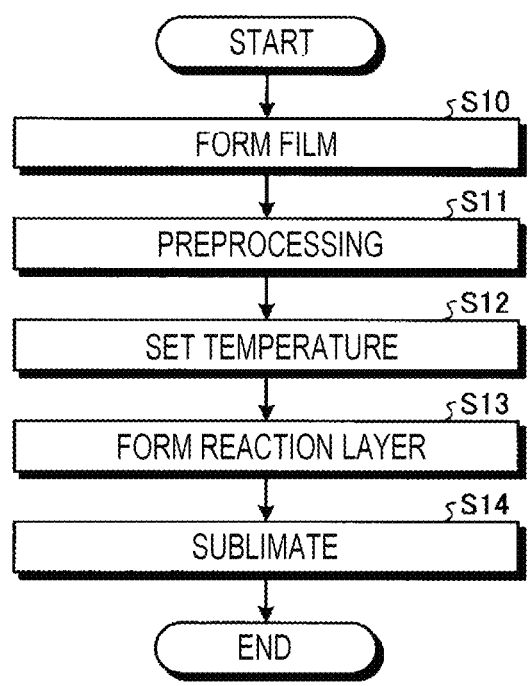
FIG. 23 is a flowchart illustrating an example of the flow of a substrate processing according to the embodiment.

Next, a flow of the substrate processing according to the present embodiment will be briefly described. FIG. 23 is a flowchart illustrating an example of the flow of the substrate processing according to the embodiment. The wafer W is transferred by a transfer mechanism and supplied to the heating apparatus 200 and the plasma processing apparatus 100 when the substrate processing is performed. For example, a mask as illustrated in FIG. 3A (see, e.g., the SiO₂ film 11 in FIG. 3A) is formed on the wafer W.

A film is formed on the mask of the wafer W (step S10). For example, the plasma processing apparatus 100 forms a SiO₂ film 20 (see, e.g., FIG. 3B) on the wafer W by the ALD.

Next, preprocessing such as heating, plasma processing, or inhibitor adsorption is performed in order to adjust the state of the wafer W (step S11). For example, the plasma processing apparatus 100 supplies electric power from the heater power supply 112 to the heater 111 to preheat the wafer W.

Next, the wafer W is controlled to a predetermined temperature of 100° C. or lower so that the reaction layer (e.g., AFS) does not sublimate (step S12). For example, plasma processing apparatus 100 controls the wafer W to a predetermined temperature of 100° C. or lower by controlling the electric power supplied from the heater power supply 112 to the heater 111 and controlling an amount of heat generated by the heater 111. The predetermined temperature is determined according to a control mode of the shape of the pattern P. For example, when the temperature of the wafer W is around 50° C., the etching amount of the $SiO_2$ film is smaller than when the temperature of the wafer W is lower than 50° C. (e.g., 10° C.). When it is desired to etch the $SiO_2$ film with high accuracy, the temperature of the wafer W is controlled to around 50° C. Further, for example, when the pattern P formed on the wafer W is dense, and when the temperature of the wafer W is around 50° C., the difference in the change (ΔCD) of the L-CD of the dense pattern P becomes smaller as compared with the case where the temperature of the wafer W is lower than 50° C. (e.g., 10° C.). When it is desired to control the L-CD of the dense pattern P with high accuracy, the temperature of the wafer W is controlled to around 50° C.

Next, a reaction layer is formed on the surface layer of the wafer W (step S13). For example, the plasma processing apparatus 100 introduces various gases used for CR processing, such as $NF_3$ gas, $NH_3$ gas, and Ar gas, from the gas supply 120 to generate plasma. As a result, a layer of AFS is formed on the wafer W.

Next, the reaction layer is removed by heating the wafer W and sublimating the reaction layer (AFS) (step S14). For example, the wafer W is transferred to the heating apparatus 200, and the wafer W is heated to a predetermined temperature of 100° C. or higher (e.g., 300° C.) by the heating apparatus 200. As a result, the $SiO_2$ film 20 is removed from the wafer W.

In the substrate processing according to the present embodiment, the flow of performing steps S10 to S14 once has been illustrated, but steps S10 to S14 may be repeated a plurality of times as needed.

Further, the substrate processing may further include an etching processing for etching the wafer W. The etching process is performed after controlling the shape of the pattern P to a desired state. For example, when the shape of the pattern P becomes a desired state by performing steps S10 to S14 once, the etching process is performed after step S14.

As described above, in the substrate processing according to the present embodiment, a film is formed on the mask of the substrate (wafer W) provided with the mask. Next, in the substrate processing, a reaction layer is formed on the surface layer of the film. Next, in the substrate processing, energy is applied to the reaction layer to remove the reaction layer. Thus, the substrate processing according to the present embodiment may control the pattern P formed on the substrate to a desired state.

Further, in the substrate processing, when more silicon-containing film is formed on the upper side of the pattern P than on the lower side, the silicon-containing film is formed by any one of CVD and QALD, or a plurality of combinations including any of them. When forming a silicon-containing film on the upper side and the lower side of the pattern P to the same extent, the film is formed by ALD. Thus, the substrate processing according to the present embodiment may control the shape of the pattern P.

Further, in the substrate processing, a plurality of cycles of forming a film, forming a reaction layer, and removing the reaction layer are repeated in the order. Thus, the substrate processing according to the present embodiment may improve the LWR and LER of the pattern P.

Although the embodiments have been described above, the embodiments disclosed this time need to be considered as illustrative in all points and not restrictive.

Indeed, the above embodiments may be implemented in a variety of forms. The embodiments described above may be omitted, substituted, or changed in various forms without departing from the scope of the appended claims and the subject matter thereof.

Further, in the above-described embodiment, the case where the substrate is a semiconductor wafer has been described as an example, but the present disclosure is not limited thereto. The substrate may be another substrate such as a glass substrate.

Further, in the embodiment, the case where the plasma processing apparatus 100 is an ICP type plasma processing apparatus has been described as an example, but the present disclosure is not limited thereto. The plasma processing apparatus 100 may be any type of plasma processing apparatus. For example, the plasma processing apparatus 100 may be a capacitively coupled parallel plate plasma processing apparatus. Further, the plasma processing apparatus 100 may be a plasma processing apparatus such as a remote source type that supplies microwave plasma, magnetron plasma, or radical rich plasma generated by a remote source to the processing chamber 102 via a pipe.

In the embodiment, the case where the wafer W is heated by the heater has been described as an example, but the present disclosure is not limited thereto. For example, any heating method may be used as long as the wafer W may be heated. For example, the wafer W may be heated by plasma, an infrared lamp, or electron beam irradiation.

In the present embodiment, the case where the substrate processing is performed by the plasma processing apparatus 100 and the heating apparatus 200 has been described as an example, but the present disclosure is not limited thereto. The substrate processing according to the embodiment may be performed by combining apparatuses other than the plasma processing apparatus 100 and the heating apparatus 200.

DESCRIPTION OF SYMBOLS

10: Si layer
11: $SiO_2$ film
20: $SiO_2$ film
100: plasma processing apparatus
200: heating apparatus
P: pattern
W: wafer

What is claimed is:

1. A substrate processing apparatus comprising:
  a chamber;
  a substrate support disposed in the chamber;
  a gas supply configured to supply a gas into the chamber; and
  a controller configured to control an overall operation of the substrate processing apparatus and execute a process comprising:
    (a) placing a substrate on the substrate support, the substrate including an etching layer and a patterned mask on the etching layer;
    (b) forming a film on the patterned mask;
    (c) forming a reaction layer on the film; and
    (d) removing the reaction layer by applying energy to the reaction layer,
    wherein in the step (c), a temperature of the substrate is set according to a thickness of the reaction layer to be formed.

2. The substrate processing apparatus according to claim 1, wherein in the step (b), a silicon-containing film is formed on the patterned mask by any one of a chemical vapor deposition (CVD), a physical vapor deposition (PVD), and an atomic layer deposition (ALD), or a combination thereof.

3. The substrate processing apparatus according to claim 1, wherein in the step (b), a silicon-containing film is formed on the patterned mask, the silicon-containing film is formed more on an upper side of the patterned mask than a lower side thereof.

4. The substrate processing apparatus according to claim 1, wherein in the step (b), a silicon-containing film is formed on the patterned mask, the silicon-containing film is formed equally on the upper side and the lower side of the patterned mask.

5. The substrate processing apparatus according to claim 1, wherein the steps (b), (c), and (d) are repeated in an order for a plurality of cycles.

6. The substrate processing apparatus according to claim 1, wherein the pattered mask is a pattered hard mask.

7. The substrate processing apparatus according to claim 1, wherein the pattered mask is formed of $SiO_2$.

8. The substrate processing apparatus according to claim 1, wherein the process further includes etching the etching layer between the step (c) and the step (d).

9. The substrate processing apparatus according to claim 1, wherein the process further includes etching the etching layer after the step (d).

10. A substrate processing apparatus comprising:
a chamber;
a substrate support disposed in the chamber;
a gas supply configured to supply a gas into the chamber; and
a controller configured to control an overall operation of the substrate processing apparatus and execute a process comprising:
(a) placing a substrate on the substrate support, the substrate including an etching layer and a patterned mask on the etching layer, the patterned mask containing a densely formed pattern and a coarsely formed pattern;
(b) forming a film on the patterned mask;
(c) forming a reaction layer on the film; and
(d) removing the reaction layer by applying energy to the reaction layer,
wherein in the step (c), a temperature of the substrate is controlled when forming the reaction layer, thereby controlling pattern widths of the densely formed pattern and the coarsely formed pattern.

11. The substrate processing apparatus according to claim 10, wherein in the step (b), a silicon-containing film is formed on the patterned mask by any one of a chemical vapor deposition (CVD), a physical vapor deposition (PVD), and an atomic layer deposition (ALD), or a combination thereof.

12. The substrate processing apparatus according to claim 10, wherein in the step (b), a silicon-containing film is formed on the patterned mask by either or both of a chemical vapor deposition (CVD) and a quasi-ALD when the silicon-containing film is formed more on an upper side of the patterned mask than a lower side thereof.

13. The substrate processing apparatus according to claim 10, wherein in the step (b), a silicon-containing film is formed on the patterned mask by an atomic layer deposition (ALD) when the silicon-containing film is formed equally on the upper side and the lower side of the patterned mask.

14. The substrate processing apparatus according to claim 10, wherein the steps (b), (c), and (d) are repeated in an order for a plurality of cycles.

15. The substrate processing apparatus according to claim 10, wherein the pattered mask is a pattered hard mask.

16. The substrate processing apparatus according to claim 10, wherein the pattered mask is formed of $SiO_2$.

17. The substrate processing apparatus according to claim 10, wherein the process further includes etching the etching layer between the step (c) and the step (d).

18. The substrate processing apparatus according to claim 10, wherein the process further includes etching the etching layer after the step (d).

* * * * *